United States Patent [19]

Brown

[11] Patent Number: 5,115,202
[45] Date of Patent: May 19, 1992

[54] CHOPPER-STABILIZED AMPLIFIER WITH SPREAD-SPECTRUM CLOCKING

[75] Inventor: James E. C. Brown, Menlo Park, Calif.

[73] Assignee: Analog Devices, Inc., Norwood, Mass.

[21] Appl. No.: 683,448

[22] Filed: Apr. 10, 1991

[51] Int. Cl.[5] .............................................. H03F 1/02
[52] U.S. Cl. ........................................ 330/9; 307/491
[58] Field of Search .................. 330/9, 149; 307/491

[56] References Cited

U.S. PATENT DOCUMENTS 4,931,745 6/1990 Goff et al. ........................... 330/9

OTHER PUBLICATIONS

Jones and Webb, "Chopper-stabilized op amp combines MOS and bipolar elements on one chip", *Electronics*, Sep. 27, 1973, pp. 209-213.

Lee and Messerschmitt, Digital Communication, Chap. 10.6, "Spread-Spectrum", Kluwer Academic Publishers, 1988, pp. 445-450.

*Primary Examiner*—James B. Mullins
*Attorney, Agent, or Firm*—Richard S. Koppel

[57] ABSTRACT

A high bandwidth chopper-stabilized amplifier operates main and auxiliary amplifiers at a randomized chopping signal frequency that substantially reduces intermodulation distortion between the input and chopping signals, clock noise and input voltage offset, thus making possible a significant increase in bandwidth. The circuit preferably uses a pseudo-random bit sequence generator to produce a pseudo-random chopping signal frequency.

9 Claims, 3 Drawing Sheets

CHOPPER-STABILIZED AMPLIFIER WITH SPREAD-SPECTRUM CLOCKING

BACKGROUND OF THE INVENTION

1. Field of the Invention

This invention relates to chopper stabilized amplifiers, and more particularly to chopper stabilized operational amplifier circuits which seek to reduce input voltage offset and noise.

2. Description of the Prior Art

Offset voltage drift has been a problem in designing circuits with operational amplifiers (op amps). The input offset voltage can generally be adjusted to a very low value with the help of an external potentiometer or selected fixed resistors, but this adjustment is good only for the ambient temperature and point in time at which it was made. With a few degrees of change in temperature or after a few months, the offset voltage may again become a problem.

Offset voltage stabilization has been accomplished by adding an auxiliary direct current (DC) amplifier to the main amplifier. The auxiliary amplifier alternately nulls its own offset and the offset of the main amplifier. The auxiliary amplifier is not responsible for amplifying the main signal and needs only a limited frequency response. Chopper-stabilized op amps are well-known and are discussed, for example, in Jones and Webb, "Chopper-stabilized op amp combines MOS and bipolar elements on one chip", Electronics, Sep. 27, 1973, pages 209-213. FIG. 1 shows the basic approach. A1 is the main amplifier, and A2 is the auxiliary amplifier. If A2 has a large gain, the effective input offset voltage of the entire circuit will be nearly equal to that of A2 by itself. This is because the input offset voltage of A1 is divided by the gain of A2 in establishing its contribution to the offset of the entire circuit. The open-loop DC gain of the overall circuit is the product of the gains of A1 and A2.

A more detailed version of the basic chopper-stabilized amplifier circuit of FIG. 1 is provided in FIG. 2a. The main amplifier is op amp A4, while the auxiliary amplifier is op amp A5. The circuit is driven by a clock circuit 4 which alternates its output between output lines 6 and 8 at a constant frequency; when the output on line 6 is high the output on line 8 is low, and vice versa. The circuit thus has two phases, with $\phi 1$ including the first phase when the output on line 6 is high, and $\phi 2$ the second phase when the output on line 8 is high.

The inverting inputs to A4 and A5 are connected through a switch S3 that is closed during $\phi 1$, while the inverting and non-inverting inputs of A5 are connected through a separate switch S4 that is closed during $\phi 2$. The input signal at terminal 10 is applied in common to the non-inverting inputs of A4 and A5. A pair of resistors R3 and R4 are connected in a feedback circuit for A4 to establish its gain. The output of auxiliary amplifier A5 is connected to the nulling input of A4 through a $\phi 1$ switch S5, and to the nulling input of A5 through a $\phi 2$ switch S6; holding capacitors C4 and C5 are connected to the nulling inputs of A4 and A5, respectively.

The chopper-stabilized amplifier circuit of FIG. 2a seeks to minimize the input offset voltage. The $\phi 1$ and $\phi 2$ switch control signals are illustrated in FIG. 2b; while one is high the other is low, and vice versa. During $\phi 1$ the circuit's open loop gain is $(1+A5)A4$, while during $\phi 2$ the circuit's open lop gain is equal to the gain of A4 by itself. The input offset voltage for A4 is equal to the different between the voltages across C4 and C5 divided by A5; minimizing this voltage difference minimizes the offset voltage.

In operation, the inputs of A5 are shorted together during $\phi 2$, and the output of A5 drives its nulling input via switch S6 in a negative feedback connection that stabilizes the nulling voltage across C5 and the A5 output. During $\phi 1$, A5 drives the nulling input to A4 via switch S5, adjusting the output of A4 so that the entire A4/A5 loop is stabilized. If the voltages across C4 and C5 are equal when the A4/A5 loop has stabilized, then there is zero voltage across the inverting and non-inverting inputs of A4, which corresponds to a zero input voltage offset.

An equivalent circuit for the described chopper-stabilized amplifier is given in FIG. 3. Two gain amplifiers G1 and G2 are shown. The gain of G1 is equal to that of A4; the gain of G2 is equal to $(1+A5)A4$. G1 is connected between the input and output terminals, and G2 is disconnected, during $\phi 2$. G2 is then switched in and G1 switched out during $\phi 1$.

A problem with this type of switching between two different gain conditions is that it introduces intermodulation distortion (IMD) between the signal and the clock frequency at which switching takes place. IMD occurs at the various sums and differences of the harmonics of the two signals, and the clock itself can introduce noise. This situation is illustrated in FIG. 4. The input signal frequency is $F_S$, while the clock frequency is $f_{CLK}$. For $f_S > F_{CLK}/2$, IMD noise spikes will be present at levels substantially above the normal noise floor. The magnitude of the IMD spikes is greatest for lower order harmonics, and generally decreases for higher order harmonics. In addition, the switch operation will normally not be perfect, and charge will be injected into the amplifiers when they are turned off, producing both a clock noise at the switch frequency $f_{CLK}$, and an increased voltage offset.

The conventional approach to overcoming these problems is to try to make the clock frequency as high as possible. However, the amplifiers are relatively slow and take time to settle to a low voltage offset level. Depending upon the particular circuit, the input offset voltage rises rapidly above a threshold clock frequency, which is typically on the order of 1–10 KHz, as illustrated in FIG. 5. This imposes a substantial limitation upon the circuit's effective bandwidth.

SUMMARY OF THE INVENTION

The present invention seeks to provide a chopper-stabilized amplifying circuit that substantially reduces IMD and clock noise, has a low input voltage offset and a high bandwidth These goals are accomplished with the present invention by operating a chopper stabilized amplifier at a randomized chopping signal frequency that substantially reduces IMD between the input signal to the main amplifier and the chopping signal. The chopping frequency is preferably a pseudo-random frequency generated by a pseudo-random bit sequence (PRBS) generator which has two output states and repeatedly cycles through a predetermined number of output bits.

These and other features and advantages of the invention will be apparent to those skilled in the art from the following detailed description, taken together with the accompanying drawings, in which:

DETAILED DESCRIPTION OF PREFERRED EMBODIMENTS

The present invention departs from the prior direction taken to reduce input voltage offset, IMD and clock noise. Rather than attempt to make the clock frequency as high as possible, applicant randomizes the clock frequency. This has been found to produce a linearization of the overall system operation, resulting in the virtual elimination of IMD and clock noise.

The invention utilizes a form of a technique referred to as spread-spectrum. This is a means of signal transmission in which the signal occupies a bandwidth in excess of the minimum bandwidth necessary to send the information. The band spread is accomplished by means of a code that is independent of the data, and a synchronized reception with the code at a receiver is normally used for de-spreading and subsequent data recovery. The technique is described in a text by Lee and Messerschmitt, *Digital Communication*, Chap. 10.6, "Spread-Spectrum", Kluwer Academic Publishers, 1988, pages 445-450.

Figure 6:
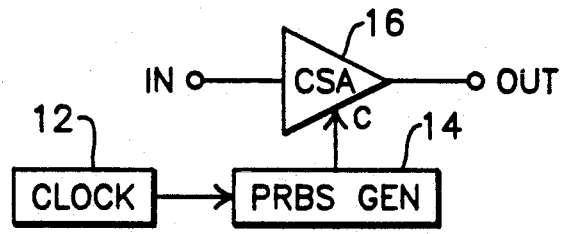
FIG. 6 is a block diagram illustrating the basic approach of the present invention towards an improved chopper-stabilized amplifier circuit.

The randomized spread-spectrum is preferably implemented by chopping the signal from the auxiliary amplifier of a chopper stabilized circuit with a pseudo-random binary sequence (PRBS). The general concept is illustrated in FIG. 6, in which a clock 12 applies a clock signal to a PRBS generator 14, which in turn applies a pseudo-random nulling signal to a chopper-stabilized amplifier 16.

PRBS generators have been used in connection with spread-spectrum communications such as frequency hopping radar carrier signals. Such applications require a synchronization of the PRBS at both the transmitter and receiver; the purpose is to obtain secure communications, rather than to reduce noise. A PRBS has also been proposed in connection with digital-to-analog converters and analog-to-digital converters to reduce noise levels by dithering the signal amplitude. Non-linearities in the circuit are reduced by varying the amplitude of the input signal in a random fashion. PRBS in general is known, and is discussed for example in the Lee and Messerschmitt text cited above at Appendix 10-A, "Maximal Length Feedback Shift Registers", pages 451-456.

The present invention uses a PRBS technique in a unique manner. The only prior uses of a PRBS to randomize a signal frequency was in spread-spectrum communications systems, in which a PRBS at the transmitter is synchronized with a PRBS at the receiver for the purpose of obtaining secure communications. The present invention, by contrast, employs a single-ended PRBS signal, for the purpose of IMD noise reduction.

Figure 1:
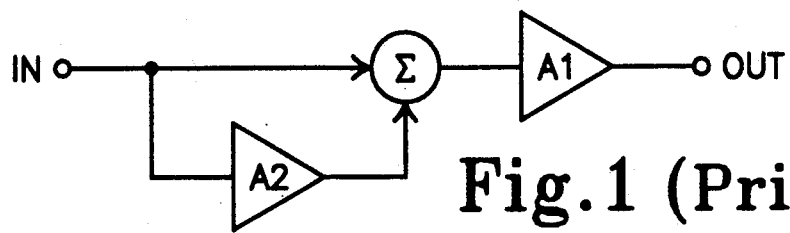
FIG. 1 is a block diagram of a conventional chopper-stabilized amplifier circuit, described above.
Figure 2A:
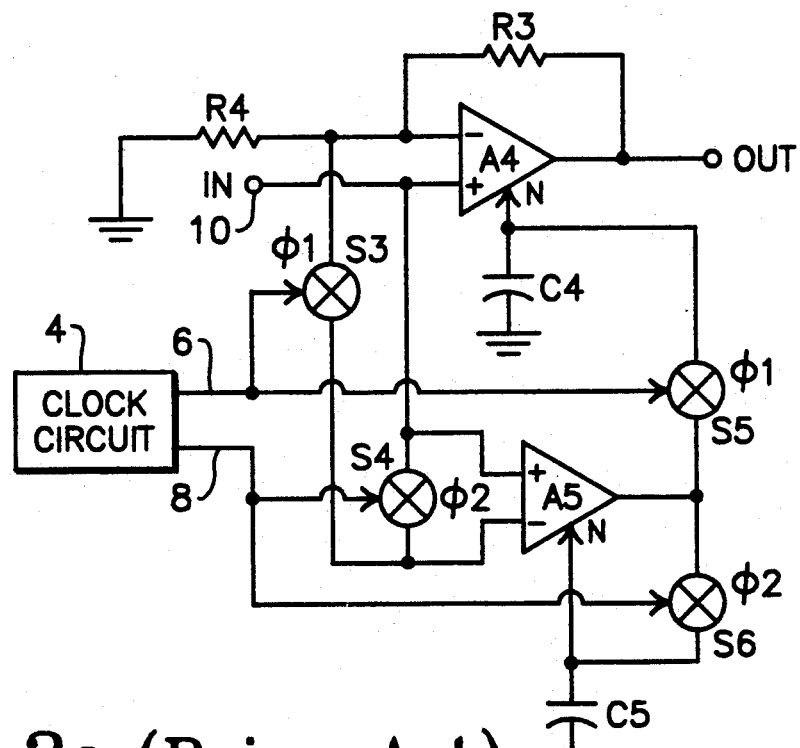
FIG. 2a is a circuit diagram showing additional features of the prior chopper-stabilized amplifier circuit, discussed above.
Figure 2B:
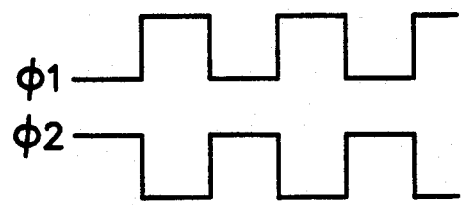
FIG. 2b is a signal diagram illustrating the clock signals employed in the circuit of FIG. 2a, discussed above.
Figure 3:
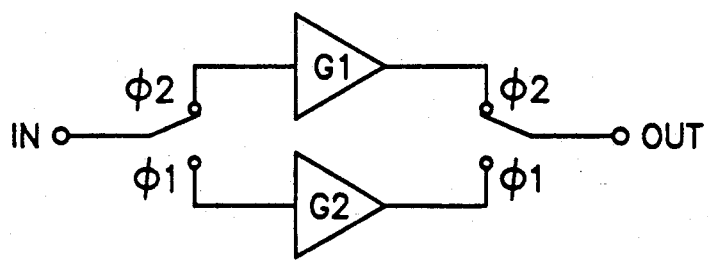
FIG. 3 is a block diagram of an equivalent circuit for that of FIG. 2a, discussed above.
Figure 4:
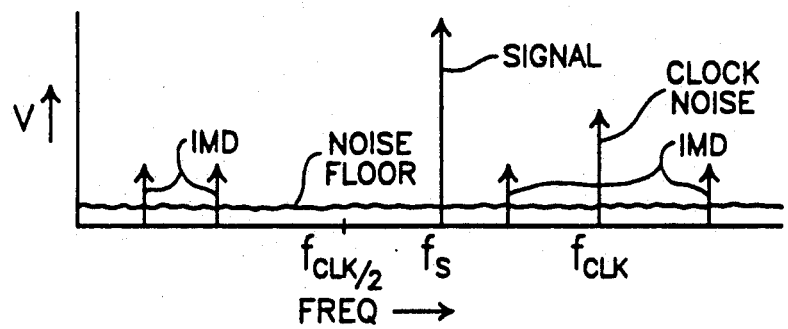
FIGS. 4 and 5 are graphs illustrating the noise and offset voltage encountered with the prior circuit, discussed above.
Figure 5:
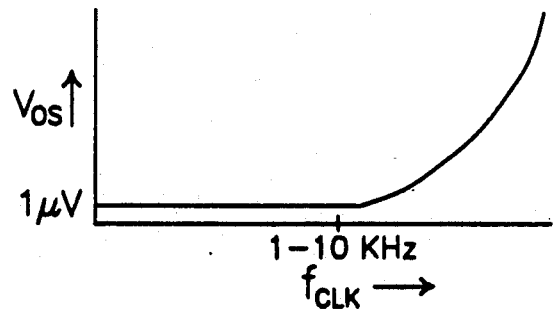
Figure 7A:
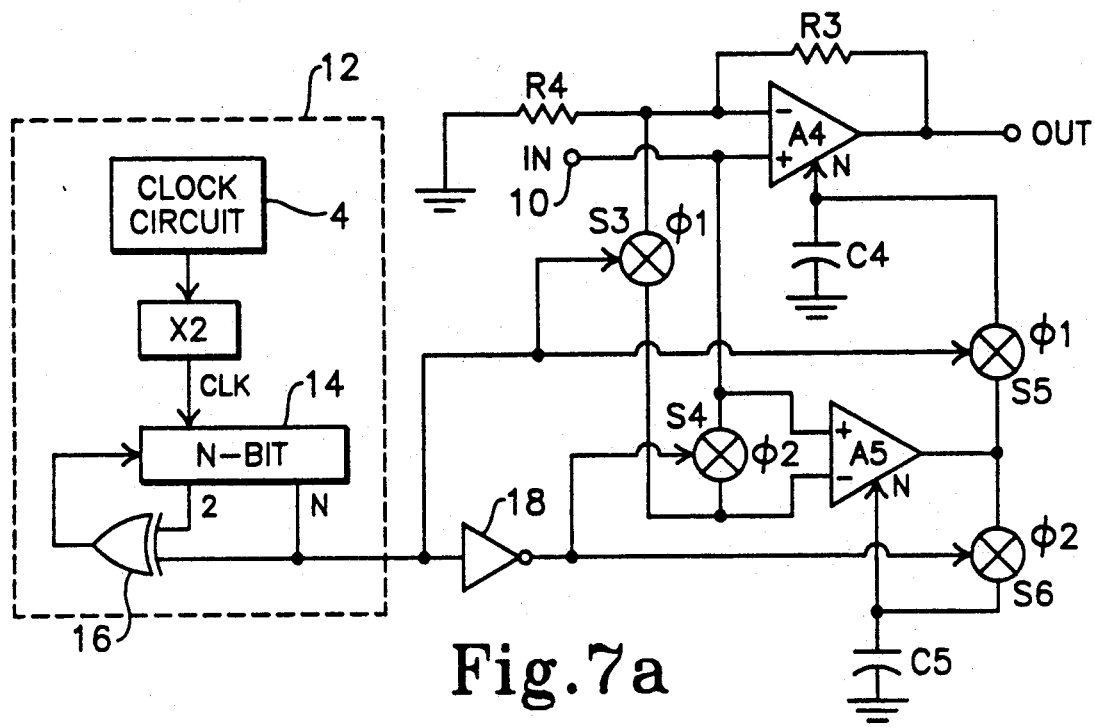
FIG. 7a is a circuit diagram showing one implementation of the invention.
Figure 7B:
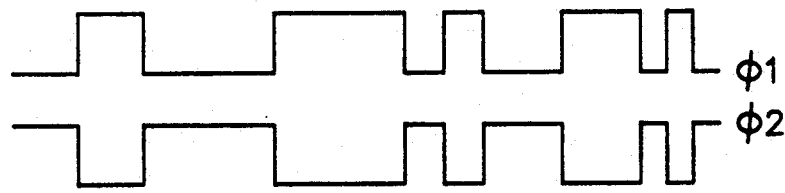
FIG. 7b is a signal diagram illustrating a possible sequence of switching signals employed with the invention.

A preferred circuit for implementing the invention is given in FIG. 7a. Elements that are common with those of the FIG. 2a circuit are identified by the same reference numerals. The principal difference from the circuit of FIG. 2a resides in the operation sequence for switches S3-S6. Rather than operating these switches at a constant frequency, they are operated at a randomized rate produced by PRBS generator 12. The PRBS generator is illustrated as a maximal length sequence generator, although alternate random signal generators could also be employed. The output of a clock circuit 4 is doubled and applied as an input to an N-bit register 14. This is a conventional circuit, in which the output from the second and the N-1 register bits are applied to an exclusive OR gate 16, the output of which is fed back to the input of the register 14. Under repeated clock inputs, the sequence generator will output all possible numbers within its capacity except zero ($2^N-1$) in a random sequence before repeating. The sequence generator's output is taken from the N-bit line. It is applied directly to switches S3 and S5 for $\phi 1$ control, and through an invertor 18 to switches S4 and S6 for $\phi 2$ control. Examples of the pseudo-random $\phi 1$ and $\phi 2$ signals are given in FIG. 7b. The two signals comprise series of complementary pulses, with $\phi 1$ high while $\phi 2$ is low, and vice versa. The duration of the pulses and of the intervals between pulses for each signal is random, corresponding to a random chopping frequency.

Figure 8:
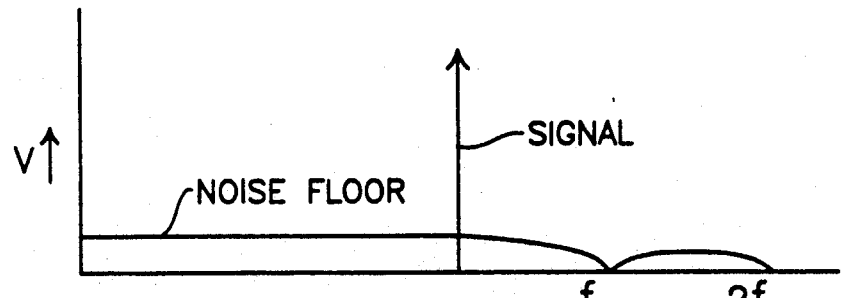
FIG. 8 is a graph of the noise characteristics associated with the invention.

The spectral characteristics of the output signal from the CSA of FIG. 7a are illustrated in FIG. 8. The randomized chopping frequency results in a virtually total elimination of both the clock noise and the IMD previously encountered. The noise floor is slightly elevated compared to that of the FIG. 2a circuit, but this is more than compensated for by the elimination of clock noise and IMD. The removal of clock noise also eliminates the bandwidth limitation previously imposed by the clock, leaving the CSA free to operate up to its full inherent bandwidth. It will be noted from FIG. 8 that the noise level drops to minimal magnitudes at both the clock frequency and its harmonics; this eliminates higher order IMD as well as IMD resulting from the basic clock frequency and its lower order harmonics.

While several embodiments of the invention have been shown and described, it should be understood that numerous variations and alternate embodiments for achieving noise and offset voltage reduction, along with a substantial increase in bandwidth, will occur to those skilled in the art. Accordingly, it is intended that the invention be limited only in terms of the appended claims.

I claim:

1. A high bandwidth chopper-stabilized amplifier (CSA), comprising:
   a main electrical signal amplifier,
   an auxiliary electrical signal amplifier connected in a chopper-stabilizer circuit with said main amplifier to reduce the input voltage offset ($V_{OS}$) of the main amplifier, and means for operating said chopper-stabilized circuit at a dynamically varying randomized chopping signal frequency that substantially reduces intermodulation distortion between the input signal to the main amplifier and the chopping signal.

2. The CSA of claim 1, said operating means comprising means for operating said chopper-stabilized circuit at a pseudo-random chopping signal frequency.

3. A high bandwidth chopper-stabilized amplifier (CSA), comprising:
a main electrical signal amplifier,
an auxiliary electrical signal amplifier connected in a chopper-stabilized circuit with said main amplifier to reduce the input voltage offset ($V_{OS}$) of the main amplifier, and
means for operating said chopper-stabilized circuit at a pseudo-random chopping signal frequency that substantially reduces intermodulation distortion between the input signal to the main amplifier and the chopping signal, said operating means including a pseudo-random bit sequence (PRBS) generator which has two output states and repeatedly cycles through a predetermined number of output bits, said PRBS generator producing one output state one time more than the other output state during each cycle.

4. A high bandwidth chopper-stabilized amplifier (CSA) comprising:
a main operational amplifier (op amp) having inverting, non-inverting and nulling inputs and an output, its output and inverting input connected in an amplifying feedback circuit,
an auxiliary op amp having inverting, non-inverting and nulling inputs and an output, its output connected to the nulling inputs of said main and auxiliary op amps through first and second switches, respectively,
a third switch connecting the inverting input of said main op amp to the inverting input of said auxiliary op amp,
a fourth switch connecting the non-inverting input of said auxiliary op amp to the inverting input of said auxiliary op amp,
main and auxiliary signal holding means connected to the nulling inputs for said main and auxiliary op amps, respectively,
chopper signal means for producing a chopping signal having alternating states and a dynamically varying randomized frequency, and
means connecting said chopper signal means with said first, second, third and fourth switches so that said first and third switches are closed and said second and fourth switches are open during one chopper signal state, and vice versa during the other chopper signal state.

5. The CSA of claim 4, said chopper signal means comprising means for producing a chopping signal having a pseudo-random frequency.

6. A high bandwidth chopper-stabilized amplifier (CSA), comprising:
a main operational amplifier (op amp) having inverting, non-inverting and nulling inputs and an output, its output and inverting input connected in an amplifying feedback circuit,
an auxiliary op amp having inverting, non-inverting and nulling inputs and an output, its output connected to the nulling inputs of said main and auxiliary op amps through first and second switches, respectively,
a third switch connecting the inverting input of said main op amp to the inverting input of said auxiliary op amp,
a fourth switch connecting the non-inverting input of said auxiliary op amp to the inverting input of said auxiliary op amp,
main and auxiliary signal holding means connected to the nulling inputs for said main and auxiliary op amps, respectively,
chopper signal means for producing a chopping signal having alternating states and a pseudo-random frequency, said chopper signal means including a pseudo-random bit sequence (PRBS) generator which has two output states and repeatedly cycles through a predetermined number of output bits, said PRBS generator producing one output state one time more than the other output state during each cycle, and
means connecting said chopper signal means with said first, second, third and fourth switches so that said first and third switches are closed and said second and fourth switches are open during one chopper signal state, and vice versa during the other chopper signal state.

7. A method of operating a chopper-stabilized amplifier (CSA) circuit, comprising:
chopping the output signal from an auxiliary amplifier,
feeding the chopped output signal to a main amplifier to reduce the CSA's input offset voltage, and
operating said CSA circuit with a dynamically varying randomized chopping frequency.

8. The method of claim 7, wherein said operating step comprises operating said CSA circuit with a pseudo-random chopping frequency.

9. The method of claim 7, further comprising the steps of generating said randomized chopping frequency in response to a fixed frequency clock signal, and using said CSA circuit to amplify an input signal having a frequency substantially greater than half the clock frequency, with substantially no intermodulation distortion between said input and clock signals.

* * * * *